United States Patent [19]

Ackerman

[11] Patent Number: 5,547,706
[45] Date of Patent: Aug. 20, 1996

[54] OPTICAL THIN FILMS AND METHOD FOR THEIR PRODUCTION

[75] Inventor: John F. Ackerman, Cheyenne, Wyo.

[73] Assignee: General Electric Company, Schenectady, N.Y.

[21] Appl. No.: 280,958

[22] Filed: Jul. 27, 1994

[51] Int. Cl.$^6$ .................................................. B05D 5/06
[52] U.S. Cl. .................. 427/166; 427/162; 427/255; 427/255.7; 427/294; 427/377; 427/419.3
[58] Field of Search ......................... 427/166, 162, 427/252, 255, 294, 377, 419.3, 255.7

[56] References Cited

U.S. PATENT DOCUMENTS

| | | | |
|---|---|---|---|
| 4,583,822 | 4/1986 | Southwell | 427/162 |
| 4,778,251 | 10/1988 | Hall | 427/166 |
| 4,868,004 | 9/1989 | Zültzke et al. | 427/166 |
| 4,931,315 | 6/1990 | Mellor | 427/166 |
| 5,170,291 | 12/1992 | Szczyrbocoski | 427/166 |
| 5,248,545 | 9/1993 | Proscia | 427/166 |
| 5,254,392 | 10/1993 | Burns | 427/166 |
| 5,271,960 | 12/1993 | Proscia | 427/166 |

*Primary Examiner*—Janyce Bell
*Attorney, Agent, or Firm*—William H. Pittman

[57] ABSTRACT

Optical thin films are produced on a substrate by alternate chemical vapor deposition of two metal oxides having different indices of refraction. Said oxides are prepared from reactants capable of decomposing to form only volatile by-products, typically alkoxides. The preferred oxides are titania and spinel.

6 Claims, 1 Drawing Sheet

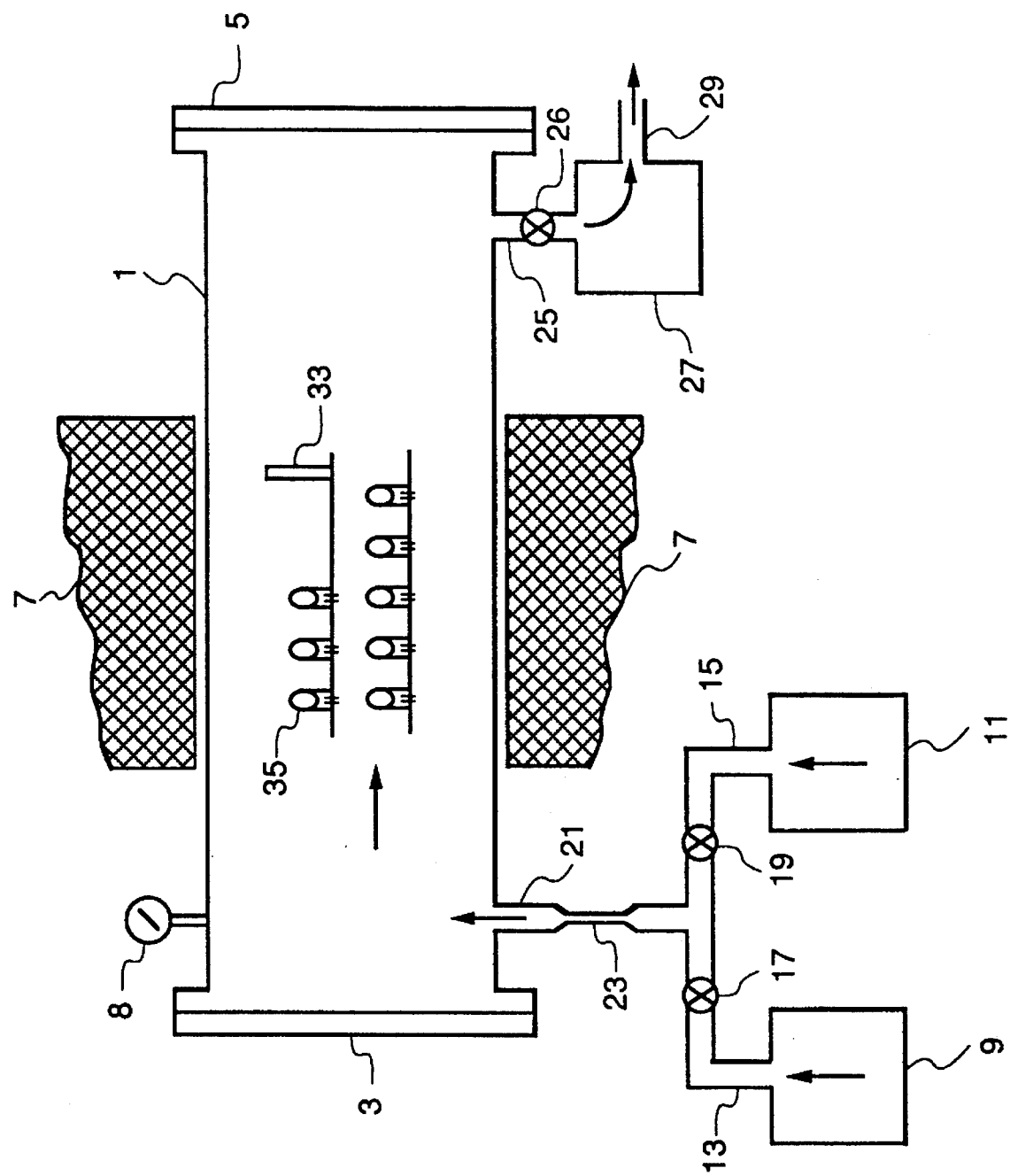

OPTICAL THIN FILMS AND METHOD FOR THEIR PRODUCTION

BACKGROUND OF THE INVENTION

This invention relates to optical thin films, and particularly to the preparation of relatively stress-free optical thin films by deposition of successive layers under substantially isothermal conditions.

The term "optical thin film", as used herein, refers to a film with unique optical properties, capable of functioning, for example, to reflect radiation within a specifically defined wavelength region; for example, the 700 nm. region. Such films are in common use in many environments. For example, they may be used as filters in lighting applications, as windows for radiation in a specific wavelength region, as non-reflective coatings on eyeglasses and as heat-reflecting coatings on gas turbine blades to reduce heat absorption thereby.

It is known to produce optical thin films comprising successive layers of silicon dioxide (silica) and tantalum pentoxide (tantala), which reflect radiation in certain wavelength regions by reason of the difference in index of refraction (1.46 and 2.2, respectively) between the two oxides. Production of such films is typically by successive evaporation of the oxides at low pressure and high temperature or by chemical vapor deposition, hereinafter "CVD", using tantalum alkoxides and tetraacyloxysilanes as reagents.

For ease of formation, the CVD operation is often carried out isothermally; i.e., at substantially the same temperature, typically about 500° C., for the silicon and tantalum reagents. This temperature is not high enough for the deposition of silica in densified form. Instead, densification takes place spontaneously during operation of the article on which the film is deposited, causing stresses which may change the optical properties of the thin film or cause failure by way of peeling, cracking and the like. It is possible to use thermal cycling techniques to densify the silica prior to use, but this adds process steps and detrimentally affects the optical properties of the film, An alternative to isothermal CVD production of optical thin films is deposition at two different temperatures, a relatively low one for the tantalum and a higher one for the silicon reagent. The low stress silica layers produced thereby are an advantage which, however, is counterbalanced by the disadvantage of required long deposition times and attendant high costs.

SUMMARY OF INVENTION

The present invention provides a new class of high quality stress-free optical thin films which may be produced under isothermal conditions. It also provides a low pressure CVD method for depositing such films which is capable of generating only volatile, easily removed by-products.

In one of its aspects (hereinafter "film aspect"), the invention is a method for producing an optical thin film which comprises alternately depositing on a substrate, by chemical vapor deposition at a substantially constant temperature, alternating layers of two metal oxides having indices of refraction differing by a value of at least 0.7; said oxides being prepared from reactants capable of decomposing to form only volatile by-products.

Another aspect of the invention (hereinafter "spinel aspect") is a method for producing a layer of $MgAl_2O_4$ on a base which comprises contacting said base with a mixed alkoxide of the formula $MgAl_2(OR)_8$, wherein R is a $C_{1-4}$ alkyl radical, at a temperature of at least about 400° C. and a pressure of at most about 125 millitorr.

Still another aspect is an article comprising a substrate having an optical thin film as a coating thereon, said coating consisting essentially of alternate layers of $MgAl_2O_4$ and $TiO_2$.

BRIEF DESCRIPTION OF THE DRAWING

The drawing is a schematic view of an illustrative apparatus in which the method of this invention may be performed.

DETAILED DESCRIPTION; PREFERRED EMBODIMENTS

The substrate on which the optical thin film is deposited according to the film aspect of the present invention is not critical; any substrate material on which such a film is desired may be employed. Typical materials are ceramics such as glass, silica and thermal barrier coatings on gas turbine blades, and metals such as cobalt- and nickel-based superalloys.

The crux of this aspect is the nature of the optical thin film. It comprises alternately deposited layers of two metal oxides having indices of refraction differing by a value of at least 0.7. Said metals must also be convertible to compounds which, upon employment in a CVD process, are capable of affording the desired metal oxides with the formation of only volatile by-products.

Preferred reagents having this property are alkoxides of relatively volatile alcohols, particularly the $C_{1-4}$ alkanols. They may be smoothly converted to the corresponding oxides with the formation of exclusively volatile by-products, typically ethers, alkanols and olefins.

Any two metal oxides satisfying the aforementioned conditions may be deposited to form optical thin films according to the present invention. An important element of the invention is that both oxides are of at least one metal, in contrast with the prior art films in which one oxide is of silicon, a metalloid. The preferred metal oxides are titanium dioxide (titania) and magnesium aluminum oxide ($MgAl_2O_4$), also known as magnesium aluminate and spinel, which have indices of refraction of 2.42 and 1.59, respectively.

Both of these oxides are capable of production from alkoxides, as illustrated by titanium(IV) ethoxide and $MgAl_2(OCH_2CH_2CH_3)_8$. Said alkoxides are in turn commercially available and/or are easily prepared. For example, $MgAl_2(OCH_2CH_2CH_3)_8$ may be prepared by the reaction of aluminum 1-propoxide with elemental magnesium chips in an excess of 1-propanol.

Upon heating to temperatures in the range of about 400°–450° C. under reduced pressure, typically in the range of about 50–125 millitorr (i.e., under low pressure CVD conditions), the alkoxides are converted to the corresponding oxides. This method of producing magnesium aluminate constitutes the spinel aspect of the invention, the base being either the substrate or the previously deposited titania layer as appropriate.

The film aspect may be conducted in the form of a low pressure CVD process by passing titanium(IV) ethoxide and $MgAl_2(OCH_2CH_2CH_3)_8$ alternately into a vessel containing the substrate(s) and maintained within the aforementioned temperature and pressure ranges, whereupon the alkoxides are cleanly converted to the corresponding oxides. No carrier gases or other reagents are required and the use of precise metering techniques to maintain proper stoichiometry is unnecessary.

At least on a small scale, it is sometimes found that the use of these alkoxides in a CVD operation without the presence of any additional gaseous materials results in the formation of small amounts of carbon on one or both metal oxide layers, especially the titania layer. Carbon formation may be suppressed or reversed by exposing said layer after formation to oxygen at a pressure in the range of about 500–1200 millitorr.

Reference is now made to the drawing which depicts a low pressure CVD apparatus suitable for performing the method of the invention. Reaction chamber 1 is sealed at both ends by caps 3 and 5 which may be fastened thereto by conventional means (not shown), including removable means such as screws or spring clips and permanent affixment by welding or the like. At least one of said caps, however, is removable so that chamber 1 may be loaded with substrates to be coated with optical thin films.

Furnace 7 is capable of heating reaction chamber 1 to a typical CVD temperature, generally at least about 400° C. and preferably about 400°–450° C. Pressure gauge 8 indicates the pressure in said reaction chamber.

Evaporation units 9 and 11, which may be effusion cells, liquid flash evaporators or the like, are charged with the alkoxide reactants to be employed for deposition of the films. They communicate with reaction chamber 1 via conduits 13 and 15 controlled by valves 17 and 19, which merge into conduit 21 fitted with flow gauge 23. Reaction chamber 1 also communicates via conduit 25, fitted with valve 26, with condenser 27 which is in turn connected to a vacuum pump (not shown) via conduit 29. Optical thickness monitor 33 of conventional design is provided to determine the thickness of the film deposited on the substrates in the chamber.

In operation, one of caps 3 and 5 is removed and the substrate(s) to be coated, shown in the drawing as light bulbs one of which is designated 35, are suitably placed in chamber 1. The cap is replaced and the chamber is evacuated by the vacuum pump to a suitable pressure for low pressure CVD as indicated by pressure gauge 8, and is heated to a suitable temperature by furnace 7. The metal alkoxides present in evaporators 9 and 11 are alternately fed to the reaction chamber by successive actuation of valves 17 and 19, with the flow rate being metered by flow gauge 23. Under these conditions, the desired successive oxide layers are formed on the substrate(s). Their thickness may be monitored by using optical thickness monitor 33, in conjunction with suitable calibration data; final thicknesses in the range of about 250–1000 Å are typical. Volatile by-products are removed by passage into condenser 27. When the requisite number of layers of the desired thickness have been produced on the substrate(s), reaction chamber 1 is reduced to atmospheric pressure and temperature and the coated substrate or substrates are removed.

The invention is illustrated by an example in which a fused silica substrate was placed in a reaction chamber of the type shown in the drawing and effusion cells 9 and 11 were charged with titanium ethoxide and $MgAl_2(OCH_2CH_2CH_3)_8$, respectively. The reaction chamber was closed, evacuated to 10 millitorr and heated to 420° C. Three portions of titanium(IV) ethoxide, interspersed with two portions of $MgAl_2(OCH_2CH_2CH_3)_8$, were introduced at pressures of 60 and 100 millitorr respectively, for times sufficient to produce successive layers of the desired thickness, typically 250–1000 Å. After deposition of each titania layer, oxygen was passed into the system through a further conduit for 5 minutes at 1 torr to burn off any carbon deposited on the substrate. The resulting optical thin films effectively reflected radiation in the 700 nm. region.

What is claimed is:

1. A method for producing an optical thin film which comprises depositing on a substrate alternating layers of titanium dioxide and magnesium aluminate by chemical vapor deposition at a constant temperature, using a titanium(IV) alkoxide of a $C_{1-4}$ alkanol and a magnesium aluminum alkoxide of a $C_{1-4}$ alkanol as reactants.

2. A method according to claim 1 wherein the reactants are titanium(IV) ethoxide and $MgAl_2(OCH_2CH_2CH_3)_8$.

3. A method according to claim 1 wherein the temperature during deposition is in the range of about 400°–450° C.

4. A method according to claim 1 wherein the pressure during deposition is in the range of about 50–115 millitorr.

5. A method according to claim 1 wherein the thickness of each layer is in the range of about 250–1000 Å.

6. A method according to claim 1 wherein the deposition of at least one layer is followed by exposing said layer after formation to oxygen at a pressure in the range of about 500–1200 millitorr.

* * * * *